US006516444B1

(12) United States Patent
Maru (10) Patent No.: US 6,516,444 B1
(45) Date of Patent: Feb. 4, 2003

(54) TURBO-CODE DECODER

(75) Inventor: Tsuguo Maru, Tokyo (JP)

(73) Assignee: NEC Corporation, Tokyo (JP)

( * ) Notice: Subject to any disclaimer, the term of this patent is extended or adjusted under 35 U.S.C. 154(b) by 382 days.

(21) Appl. No.: 09/611,228

(22) Filed: Jul. 6, 2000

(30) Foreign Application Priority Data

Jul. 7, 1999 (JP) .......................................... 11-192467

(51) Int. Cl.$^7$ ........................................... H03M 13/03
(52) U.S. Cl. ...................................... 714/795; 714/796
(58) Field of Search .............................. 714/792, 790, 714/791, 794, 795, 796, 752, 758, 701; 375/262, 265, 341; 708/315, 420, 530, 813

(56) References Cited

U.S. PATENT DOCUMENTS

| | | | |
|---|---|---|---|
| 6,263,474 B1 * | 7/2001 | Watanabe | 375/262 |
| 6,351,832 B1 * | 2/2002 | Wei | 714/701 |
| 6,381,728 B1 * | 4/2002 | Kang | 375/265 |
| 6,393,076 B1 * | 5/2002 | Dinc et al. | 375/341 |

OTHER PUBLICATIONS

C. Berrou et al., "Near Shannon Limit Error—Correcting Coding and Decoding : Turbo–Codes (1)", Proceeding of International Conference of Communication, May 1993, pp. 1064–1070 with Abstract (IEEE).

L.R. Bahl et al., "Optimal Decoding of Linear Codes of Minimizing Symbol Error Rate", IEEE Transactions on Information Theory, Mar. 1974, pp. 284–287 with Abstract.

\* cited by examiner

Primary Examiner—Christine T. Tu
(74) Attorney, Agent, or Firm—Sughrue Mion, PLLC (57) ABSTRACT

A turbo-code decoder includes a first reception signal memory, second reception signal memory, a priori memory, first adder, first selector, and second selector. The first reception signal memory stores an information sequence. The second reception signal memory stores first and second parity sequences. The a priori memory stores extrinsic/ previous information in repetitive processing. The first adder adds the information sequence read out from the first reception signal memory and the previous information read out from the a priori memory. The first selector selects one of the first and second parity sequences read out from the second reception signal memory. On the basis of a polarity of a calculation result from the first adder and that of a selection output from the first selector, the second selector selects one of the sum from the first adder including a negative polarity, the selection output from the first selector including a negative polarity, a sum of the sum and selection result, and zero. An α metric and β metric are calculated on the basis of an output from the second selector.

10 Claims, 11 Drawing Sheets

TURBO-CODE DECODER

BACKGROUND OF THE INVENTION

The present invention relates to a turbo-code decoder and, more particularly, to a high-speed turbo-code decoder with low power consumption, which is suitable for a portable telephone LSI (Large Scale Integrated circuit).

Conventionally, soft decision on decoding of error correction used for land mobile communication systems or the like is becoming an essential function because of its high coding gain, as is represented by a soft decision Viterbi decoder. In recent years, a new coding method called turbo-code encoding that attains the correcting performance close to the Shannon limit is disclosed in Berrou et al, NEAR SHANNON LIMIT ERROR-CORRECTING CODING AND DECODING: TURBO-CODES (1)", Proceeding of International Conference of Communication, pp. 1064–1070, May 1993 (reference 1).

For land mobile communication systems of next generation, wide band multimedia communications for not only voice data but also the high-speed Internet or moving image are expected to flourish, and demand has arisen for a new scheme capable of providing these communications as mobile multimedia services. Under these circumstances, application of turbo-codes to the next-generation land mobile communication systems has been actively examined. To apply turbo-codes to a portable telephone or the like in consideration of wide band multimedia communication, a high-speed turbo-code decoder with low power consumption must be implemented.

SUMMARY OF THE INVENTION

It is an object of the present invention to provide a turbo-code decoder, i.e., a decoding scheme having higher performance than that of soft decision Viterbi decoding, in a form suitable for a mobile information terminal represented by a portable telephone so as to provide a high-speed turbo-code decoder with low power consumption.

In order to achieve the above object, according to the present invention, there is provided a turbo-code decoder comprising a first reception signal memory for storing an information sequence, a second reception signal memory for storing first and second parity sequences, an a priori memory for storing extrinsic/previous information in repetitive processing, a first adder for adding the information sequence read out from the first reception signal memory and the previous information read out from the a priori memory, first selection means for selecting one of the first and second parity sequences read out from the second reception signal memory, and second selection means for, on the basis of a polarity of a calculation result from the first adder and a polarity of a selection output from the first selection means, selecting one of the sum from the first adder including a negative polarity, the selection output from the first selection means including a negative polarity, a sum of the sum and selection result, and zero, wherein an $\alpha$ metric and $\beta$ metric are calculated on the basis of an output from the second selection means.

DESCRIPTION OF THE PREFERRED EMBODIMENTS

The present invention will be described below in detail with reference to the accompanying drawings.

Figure 9:
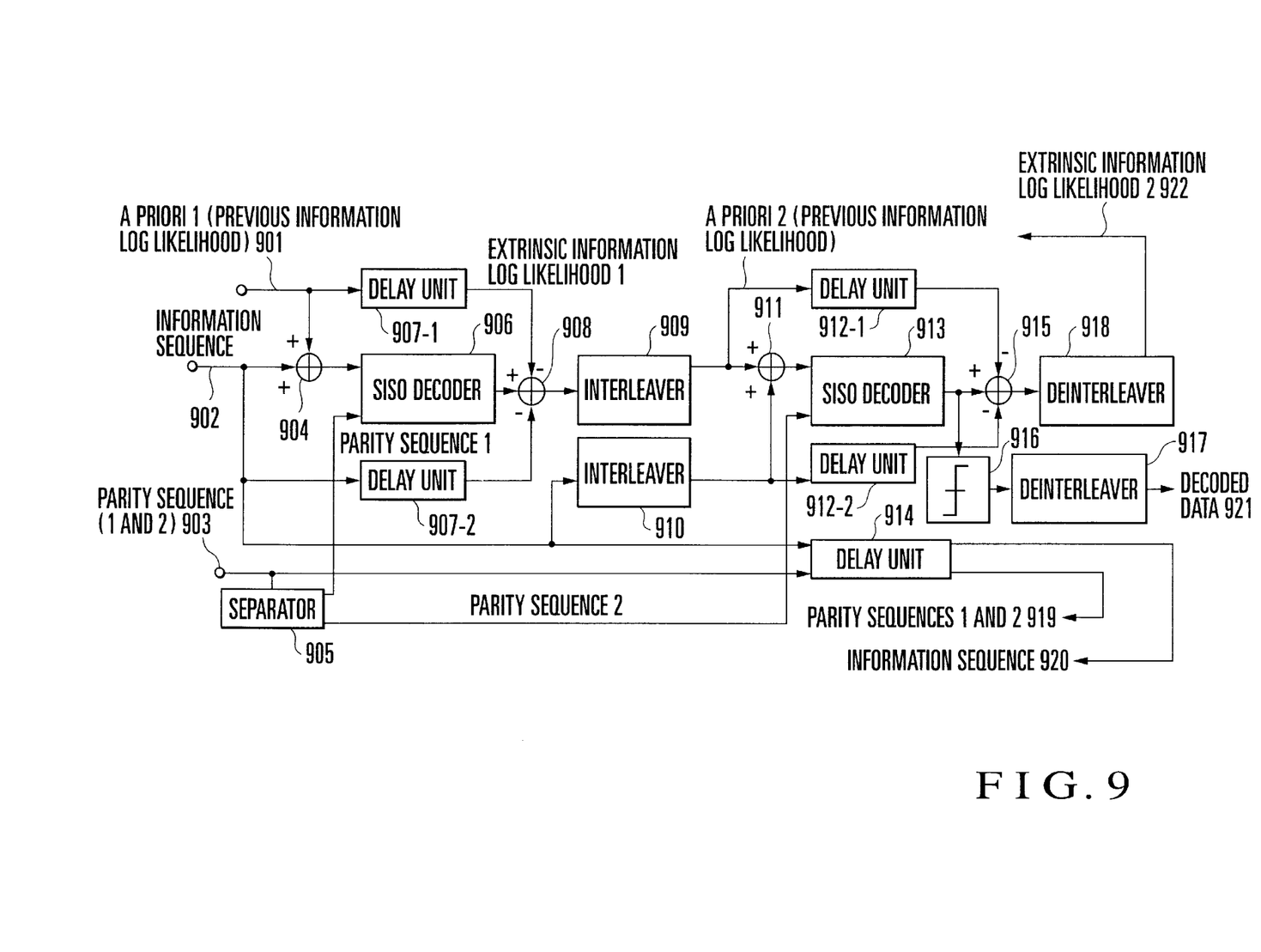
FIG. 9 is a general block diagram showing the algorithm of a turbo-code decoder.
Figure 11:
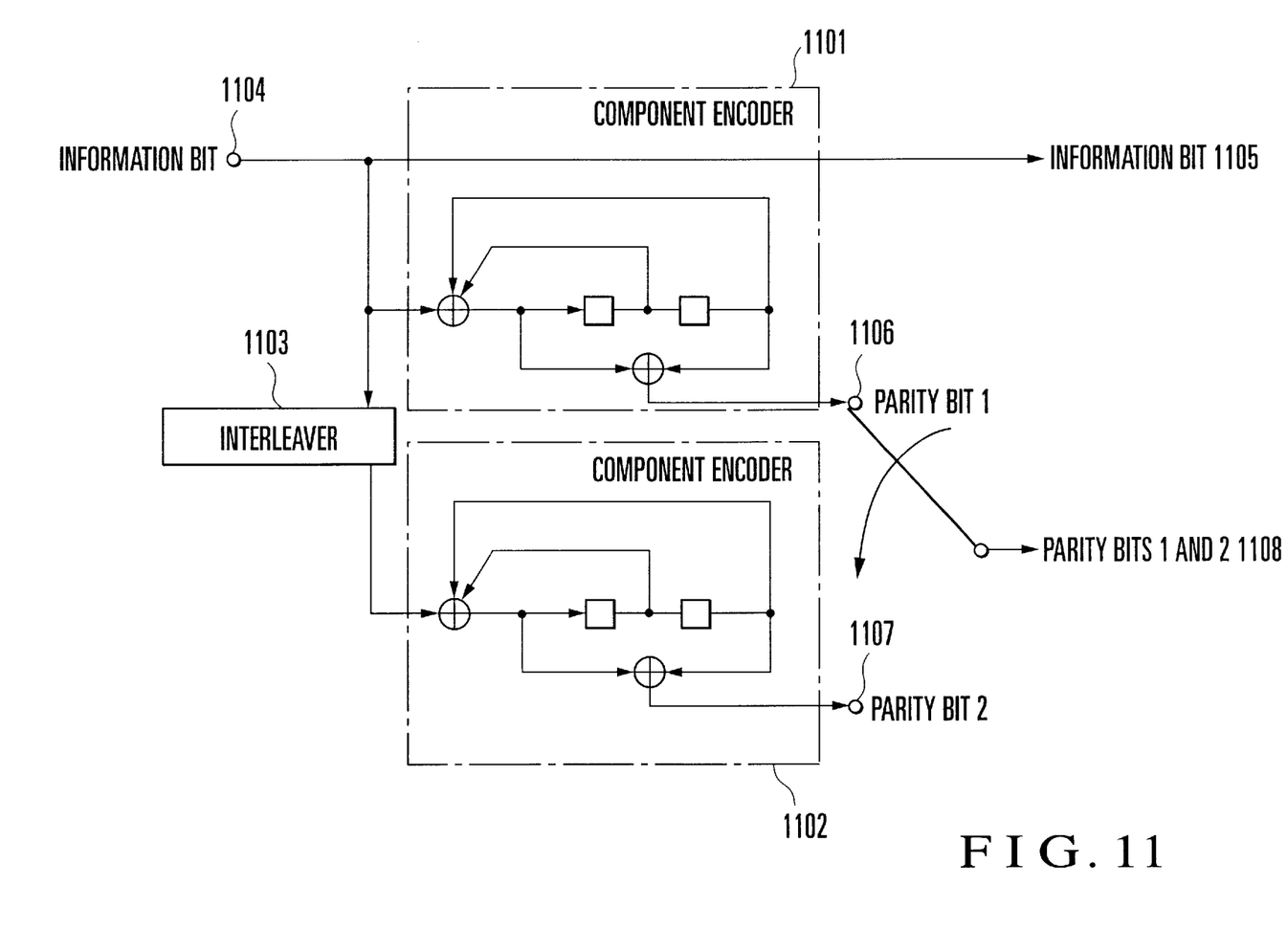
FIG. 11 is a general block diagram showing the algorithm of a turbo-code encoder.

FIGS. 11 and 9 show examples of general turbo-code encoder and decoder. In the encoder shown in FIG. 11, an information bit is supplied from an input 1104 and input to component encoders 1101 and 1102 each formed from a recursive convolutional encoder called a component encoder. A plurality of component encoders are normally used. In this example, two component encoders are used. As a characteristic feature of a turbo-code, it is a systematic code. For this reason, the component encoder 1101 outputs an information bit 1105 together with a parity bit 1106.

The component encoder 1102 has the same structure as that of the component encoder 1101 and receives the information bit 1104 from the input 1104 through an interleaver 1103. The interleaver 1103 plays an important role in forming turbo-codes. However, this interleaver is not directly related to the present invention, and a detailed description thereof will be omitted.

Since the component encoder 1101 outputs an information bit, the component encoder 1102 need not send it again and outputs only a parity bit 1107. The parity bits 1106 and 1107 generated may be interleaved by appropriate puncturing and output. In this example, the parity bits are alternately output as a parity bit 1108 next to the information bit 1105, so the information rate is ⅓.

FIG. 9 shows a general turbo-code decoder for decoding turbo-codes generated in the above way. Referring to FIG. 9, an information sequence 902 and parity sequence (1 and 2) 903 are soft decision reception data including errors generated when date generated using the encoder shown in FIG. 11 is transmitted through a transmission medium. Soft-in/soft-out (SISO) decoders 906 and 913 will be described with reference to the above-described encoder.

The SISO decoder 906 corresponds to the component encoder 1101 shown in FIG. 11. The sum of the information sequence 902 and previous information LOG likelihood (log-likelihood ratio; a logarithm representing the ratio of the likelihood of a desired reception symbol to that of a reception symbol which has an antinomic relationship to the reception symbol) 901, which is calculated by an adder 904, is input to the SISO decoder 906. Previous information LOG likelihood for the first time is zero and has no priority. The parity sequence (1) is separated by a separator 905 and input to the SISO decoder 906.

The output from the SISO decoder 906 represents LOG likelihood for each bit of the information sequence. When previous information LOG likelihood and information sequence component, which are synchronized by delay units 907-1 and 907-2, are subtracted from the LOG likelihood by an adder 908, extrinsic information LOG likelihood is generated. This extrinsic information LOG likelihood is scrambled by interleavers 909 and 910 together with the information sequence and output to the SISO decoder 913. The SISO decoder 913 corresponds to the component encoder 1102 shown in FIG. 11. The extrinsic information LOG likelihood from the interleaver 909 is used as previous information LOG likelihood.

As in the above-described SISO decoder 906, the previous information LOG likelihood and information sequence are added by an adder 911, and the sum is input to the SISO decoder 913. The parity sequence (2) is separated by the separator 905 and input to the SISO decoder 913. The output from the SISO decoder 913 represents LOG likelihood for each bit of the interleaved information sequence. When the previous information LOG likelihood and information sequence component, which are synchronized by delay units 912-1 and 912-2, are subtracted from the LOG likelihood by an adder 915, extrinsic information LOG likelihood 922 is generated. The extrinsic information LOG likelihood 922 is returned to the original order by a deinterleaver 918 and returned to the SISO decoder 906 for the next processing. In a similar manner, a parity sequence (1 and 2) 919 and information sequence 920 are also synchronized by a delay unit 914 and returned for the next processing.

When this processing is repeated, the error correction ability gradually becomes high. That is, a more satisfactory result can be obtained by repeatedly using the soft decision output. The LOG likelihood from the SISO decoder 913, which has been repeatedly processed, is finally subjected to hard decision by a decider 916 and returned to the original order by a deinterleaver 917, thereby obtaining decoded data 921. The present invention implements the above-described algorithm in a form suitable to mobile communication.

Figure 10:
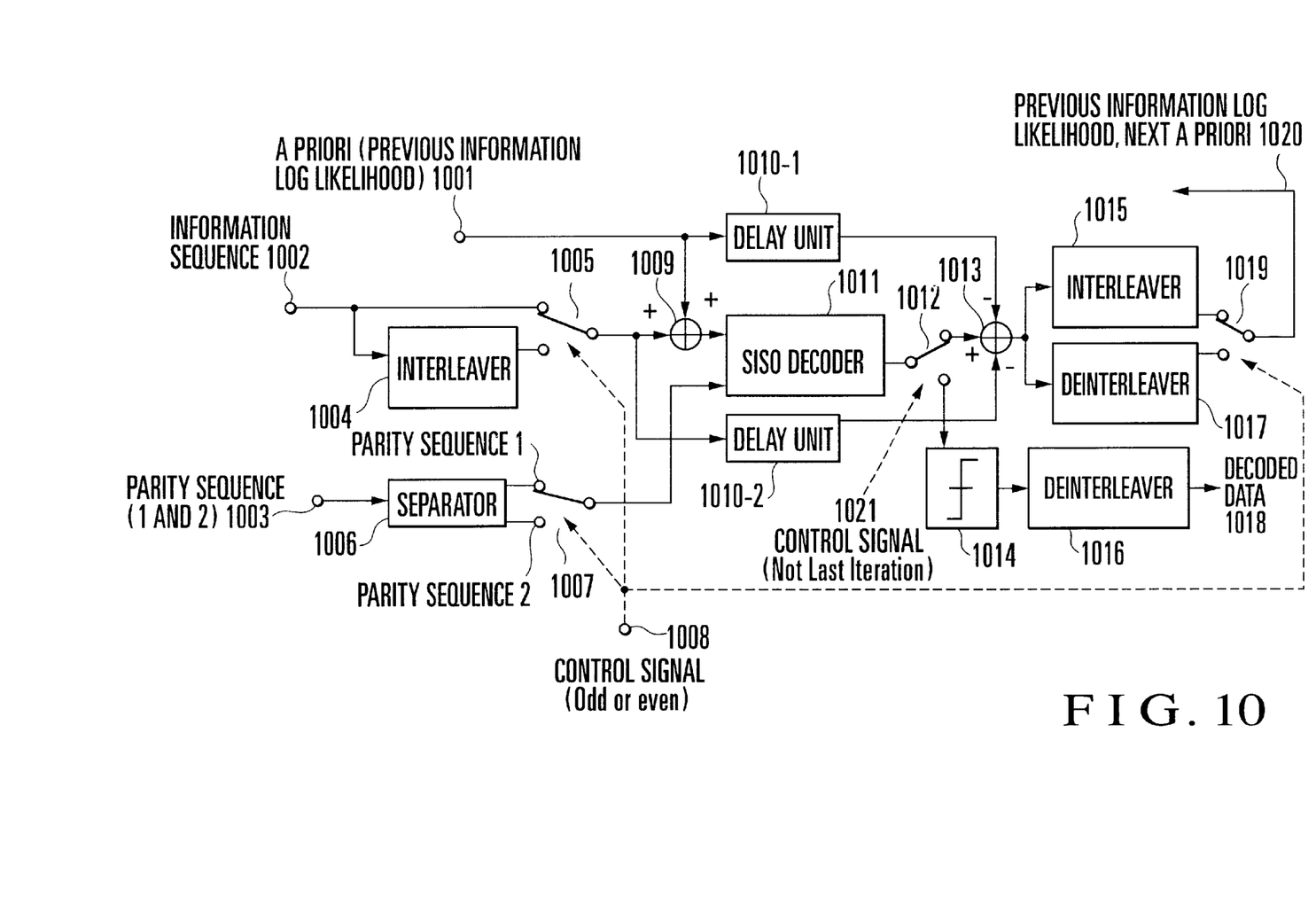
FIG. 10 is a block diagram showing the outline of the present invention.

FIG. 10 shows the outline of the present invention, though the characteristic feature of the present invention is not apparent from FIG. 10. The contents of the present invention will be described later. First, this block diagram will be described to help understanding the overall arrangement. As in the above description, a SISO decoder 1011 functions as a main unit. FIG. 10 is different from FIG. 9 in that one SISO decoder 1011 is used. Hence, an information sequence 1002 is selectively passed through an interleaver 1004 using a switch 1005 in even- and odd-numbered operations.

A parity sequence 1003 is also switched between parity sequences 1 and 2 using a separator 1006 and switch 1007 and input to the SISO decoder 1011. Previous information LOG likelihood 1001 and the selected information sequence are added by an adder 1009 and input to the SISO decoder 1011. The output from the SISO decoder 1011 represents LOG likelihood. An adder 1013 subtracts the previous information LOG likelihood and information sequence, which are synchronized by a delay unit 1010, from the LOG likelihood. Extrinsic information LOG likelihood is obtained as a result and used as previous information LOG likelihood 1020 for the next time.

The order of information bits changes depending on whether the next processing is odd- or even-numbered processing. To cope with this, an interleaver 1015 and deinterleaver 1017 are arranged and switched by a switch 1019. A control signal 1008 for controlling this switching is also used as a control signal for the switch 1005.

When soft decision information is repeatedly used, the error correction ability gradually becomes high. The final LOG likelihood is decided by a decider 1014 through a switch 1012 using a control signal 1021. The decider 1014 does hard decision of LOG likelihood. The decision result is returned to the original order by a deinterleaver 1016, so decoded data 1018 can be obtained.

The first embodiment of the present invention will be described next with reference to FIGS. 1, 2A, and 2B. A reception signal memory 101 stores an information sequence, and a reception signal memory 102 stores first and second parity sequences. In this example, the first or second parity sequence is selected by a selector 105. However, a parity sequence may be appropriately selected by address control by selectively storing parity sequences at upper and lower addresses of a single memory.

Previous information LOG likelihood and extrinsic information LOG likelihood (to be referred to as previous/extrinsic information LOG likelihood hereinafter) are alternately stored in a priori memories 103-1 and 103-2. More specifically, when one memory is used for a read as a previous information LOG likelihood memory, the other memory is used for a write as an extrinsic information LOG likelihood memory. In the next cycle, the memory used as a previous information LOG likelihood memory is overwritten as an extrinsic information LOG likelihood memory, and the memory used as an extrinsic information LOG likelihood memory is used for a read as a previous information LOG likelihood memory. A single memory can be used by employing a dual-port memory. In this case, a read and write are executed without causing mismatching therebetween. A method therefor will be described later in detail.

An adder 104 adds the information sequence extracted from the reception signal memory 101 and the previous information LOG likelihood extracted from the a priori memory 103. Before inputting the previous information LOG likelihood to the adder 104, ½ operation is performed by a calculator 116. This is because in writing extrinsic information LOG likelihood in the previous processing, only one likelihood for an information bit has been handled. The ½ operation is performed for uniform assignment to the two likelihoods in the read. This processing can be realized by only shift connection of wires. The sum from the adder 104 and the parity sequence selected by the selector 105 are input to two's complement circuits 203 and 204 with control terminals, respectively, as shown in FIG. 2A.

Each of the complement circuits 203 and 204 has a function of calculating two's complement of input data or directly outputting the value of input data in accordance with the signal level of the control terminal. A most significant bit 201 representing the polarity of input data is input to the control terminals of the complement circuits 203 and 204. With this function, outputs from the complement circuits 203 and 204 always output negative values while holding their absolute values. Hence, the output from an adder 205 for calculating the sum of values has a negative sum value while holding the absolute value.

Let y(1) be the sum of the information sequence and previous information LOG likelihood, and y(2) be the selected parity sequence. Operation to be described below corresponds to the γ metric of BCJR algorithm in soft decision decoding, to which the normalization function is imparted. The BCJR is described in detail in "Correction to 'On the Error Probability for a Class of Binary Recursive Feedback Strategies'", IEEE TRANSACTION ON INFORMATION THEORY, pp. 284–287, March 1974 (reference 2).

In the present invention, the γ metric corresponds to the branch metric in normal Viterbi decoding and is different from normal Viterbi decoding in that the γ metric has previous information LOG likelihood. Types of γ metric are as follows $\Gamma(0,0)=y(1)+y(2)$
$\Gamma(0,1)=y(1)-y(2)$
$\Gamma(1,0)=-y(1)+y(2)$
$\Gamma(1,1)=-y(1)-y(2)$ The γ metric can be normalized in four types depending on the polarities of $y(1)$ and $y(2)$.

When $y(1)=+$, and $y(2)=+$,
$\Gamma(0,0)=0$, $\Gamma(0,1)=-y(2)$, $\Gamma(1,0)=-y(1)$,
$\Gamma(1,1)=-y(1)-y(2)$
When $y(1)=+$, and $y(2)=-$,
$\Gamma(0,0)=y(2)$, $\Gamma(0,1)=0$, $\Gamma(1,0)=-y(1)+y(2)$,
$\Gamma(1,1)=-y(1)$
When $y(1)=-$, and $y(2)=+$,
$\Gamma(0,0)=y(1)$, $\Gamma(0,1)=y(1)-y(2)$, $\Gamma(1,0)=0$,
$\Gamma(1,1)=-y(2)$
When $y(1)=-$, and $y(2)=-$,
$\Gamma(0,0)=y(1)+y(2)$, $\Gamma(0,1)=y(1)$, $\Gamma(1,0)=y(2)$, $\Gamma(1,1)=0$ The normalization method is not limited to this. For example, instead of using 0, a predetermined value may be added to all the values. In this embodiment, however, a description will be made on the basis of the above method.

All the γ metrics $\Gamma(0,0)$, $\Gamma(0,1)$, $\Gamma(1,0)$, and $\Gamma(1,1)$ can be represented by combining the outputs from the complement circuits 203 and 204, the output from the adder 205, and 0. To enable selection by these combinations, four selectors 206 to 209 are selected by a most significant bit 202 representing the polarity of input data.

With this arrangement, processing of one stage be equivalently performed by one clock even when a pipeline structure is applied. In addition, since this can be implemented by a simple circuit arrangement, a γ metric suitable for low power consumption can be generated without generating any speed neck. That is, wide band multimedia communication for the high-speed Internet or moving image can be provided in a form suitable to a portable terminal.

The second embodiment of the present invention will be described next with reference to FIGS. 3 to 5. Calculation to be described herein corresponds to an α metric, β metric, and likelihood calculation in the BCJR algorithm in soft decision decoding. Details are disclosed in the above-described reference 2. Approximation based on the maximum value is used in calculating the LOG likelihood. This corresponds to calculation in so-called MAX-LOGMAP.

Figure 3:
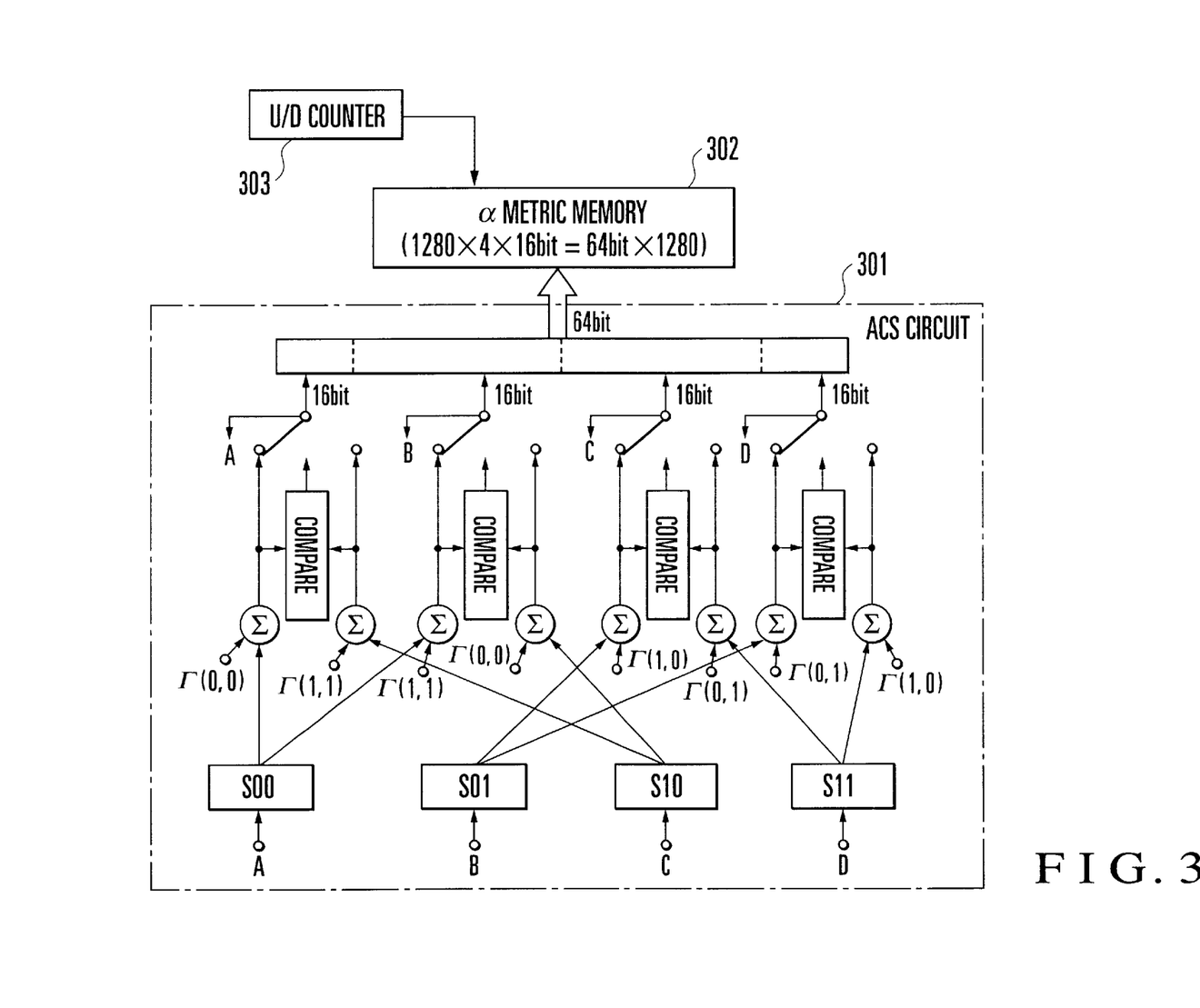
FIG. 3 is a block diagram showing $\alpha$ metric generation of the present invention.

FIG. 3 schematically shows the α metric calculation process. The α metric can be realized by an ACS (Add-Compare-Select) circuit 301 on the basis of a γ metric. FIG. 4 shows a case wherein complete parallel calculation is performed for a metric having four states (S00, S01, S10, and S11). Referring to signal points A and A, B and B, C and C, and D and D are connected to each other. The state metric is updated through a state register (S00, S01, S10, and S11). The calculation result is stored in an a memory 302. An up/down (U/D) counter 303 for address control of the α metric memory is incremented for every information bit. The counter 303 has a length corresponding to the information bit length as a count width. The final bit is the final address.

Figure 4:
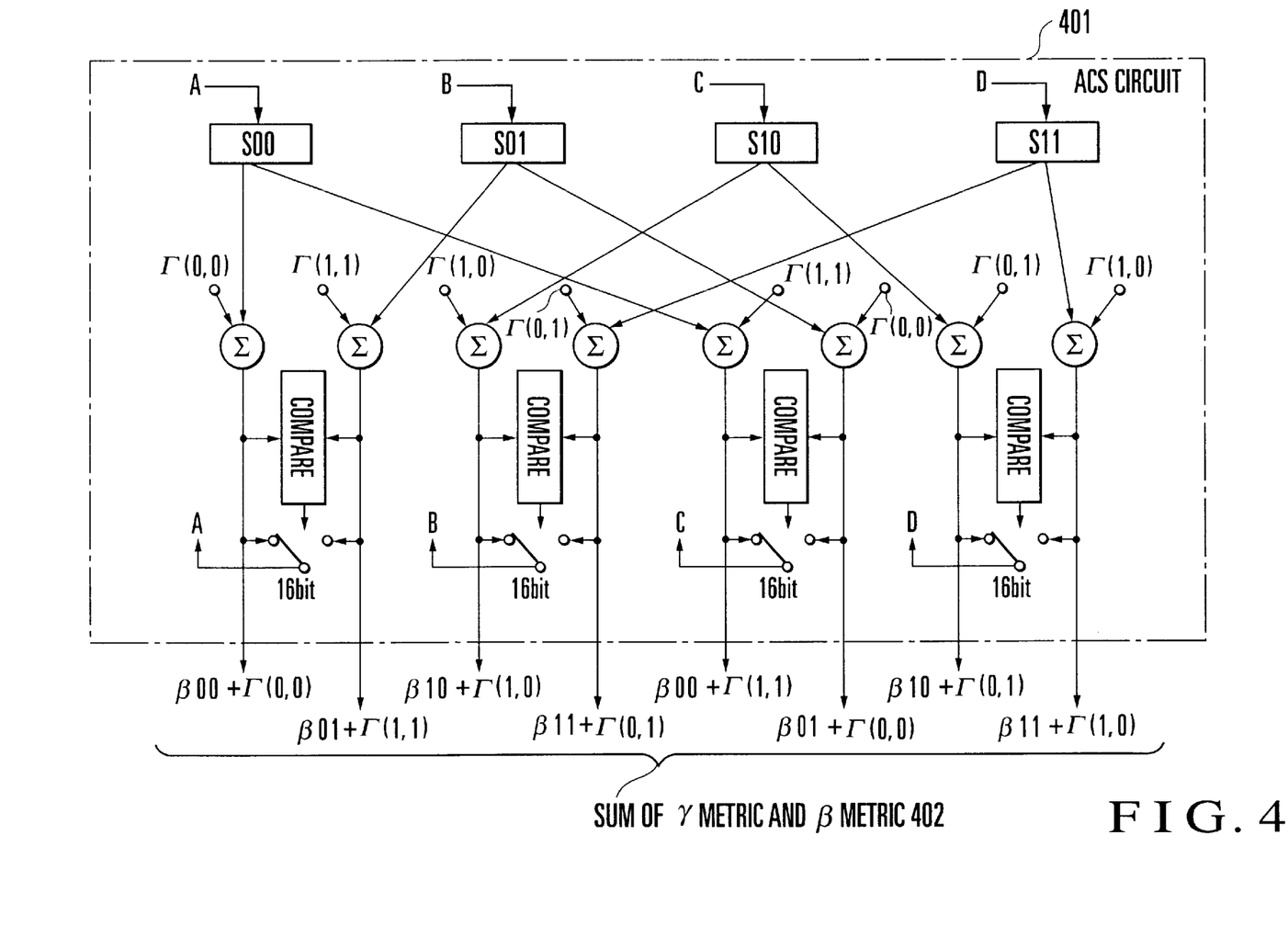
FIG. 4 is a block diagram showing part of $\beta$ metric generation and likelihood calculation of the present invention.

FIG. 4 schematically shows the β metric calculation process. The β metric can also be realized by an ACS circuit on the basis of a γ metric. In this embodiment, the calculation time does not overlap the time of the above-described α metric calculation. For this reason, signal line connection is switched by a selector (not shown), and the ACS circuit used for the α metric is applied. FIG. 4 shows an ACS circuit 401 rearranged for this application.

The main difference between the β metric block and the above-described α metric block will be described. In the α metric, metrics of all states at each time are stored in the α metric memory 302. To the contrary, in the β metric, only metrics at single target time are stored in the state register (S00, S01, S10, and S11) for updating. This is because the update direction of α metric is reverse to that of β metric. For this reason, to obtain likelihood for an information bit at target time, an α metric and β metric corresponding to that time are necessary. For this purpose, one of the two blocks always requires a memory for storage.

The arrangement and operation of the ACS circuit are known, and a detailed description thereof will be omitted. In the β metric update process, a sum 402 of the γ metric and β metric can be obtained. As a characteristic feature of the second embodiment, this result is applied to the next likelihood calculation.

Figure 5:
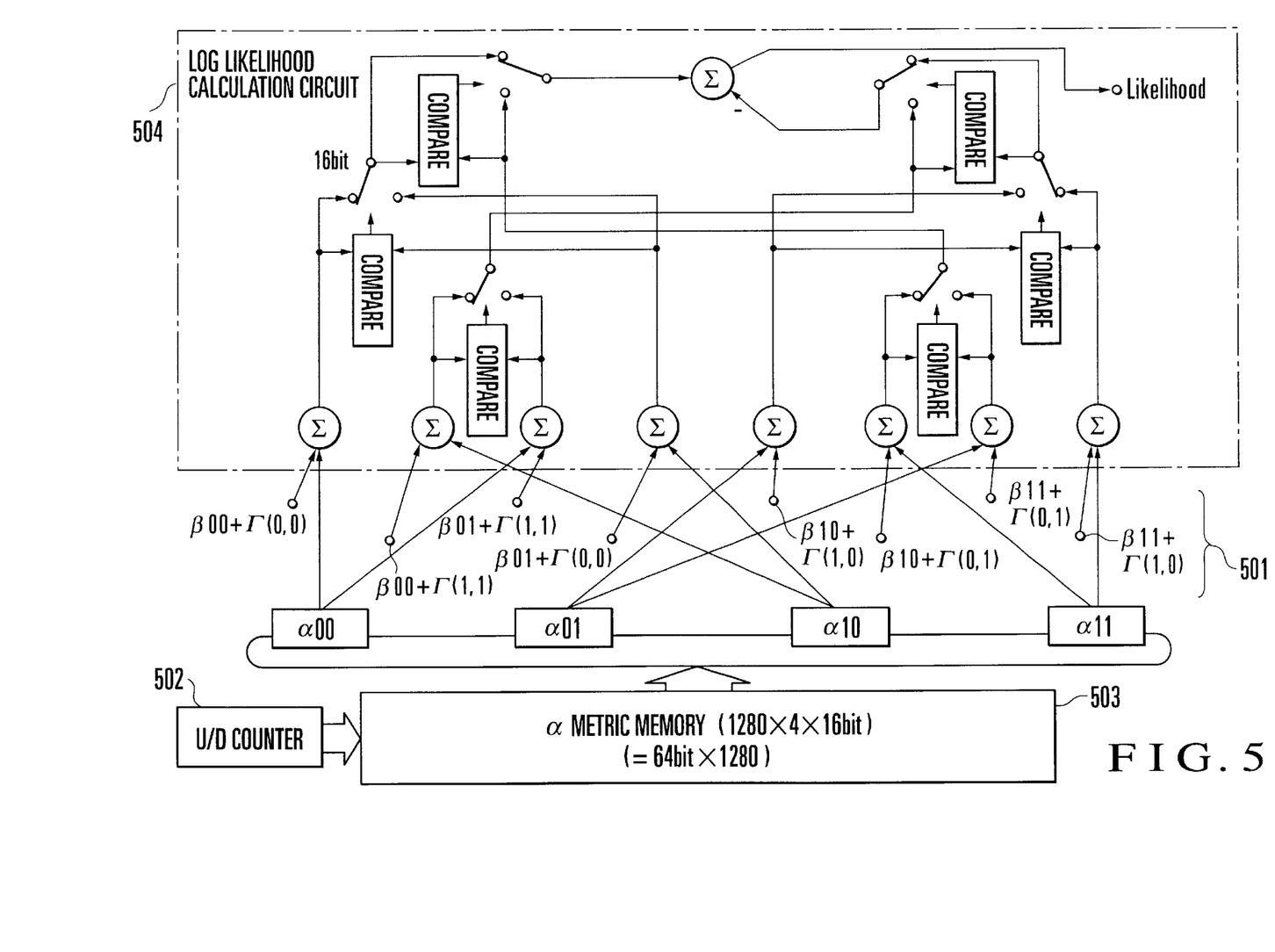
FIG. 5 is a block diagram showing likelihood calculation of the present invention.

FIG. 5 shows an arrangement for executing the likelihood calculation. Referring to FIG. 5, a sum 501 of the γ metric and β metric is input. Simultaneously, a time metric corresponding to the β metric calculation target time is read out from an α metric memory 503. Normally, update processing for the αmetric progresses in the chronological order while update processing for the β metric starts from the final bit. Hence, when likelihood calculation is executed in accordance with processing of β metric, the likelihood calculation progresses while decrementing a counter 502 from the address representing the final time in an α metric memory 530.

Referring to FIG. 5, a LOG likelihood calculation circuit 504 operates in accordance with this processing and outputs a LOG likelihood result. These processing operations are one-direction operations and therefore can be pipelined. Although not illustrated, an F/F (flip-flop) is appropriately inserted. For this reason, processing for one information bit is equivalently executed by one clock.

The α metric memory 503 and counter 502 are the same as the memory 302 and counter 303 shown in FIG. 3 and are illustrated again for the descriptive convenience. As a characteristic feature of this embodiment for this point, the β metric and γ metric are not particularly calculated for likelihood calculation. More specifically, the calculation result obtained by updating the β metric is applied to likelihood calculation, and this processing is equivalently completed by one clock, thereby omitting the memory for the β metric.

With this arrangement, even when a pipeline structure is applied, processing of one stage can be equivalently performed by one clock, and the circuit can be largely simplified. For this reason, likelihood calculation can be performed with low power consumption and without generating any speed neck. That is, wide band multimedia communication for the high-speed Internet or moving image can be provided in a form suitable to a portable terminal.

Figure 6:
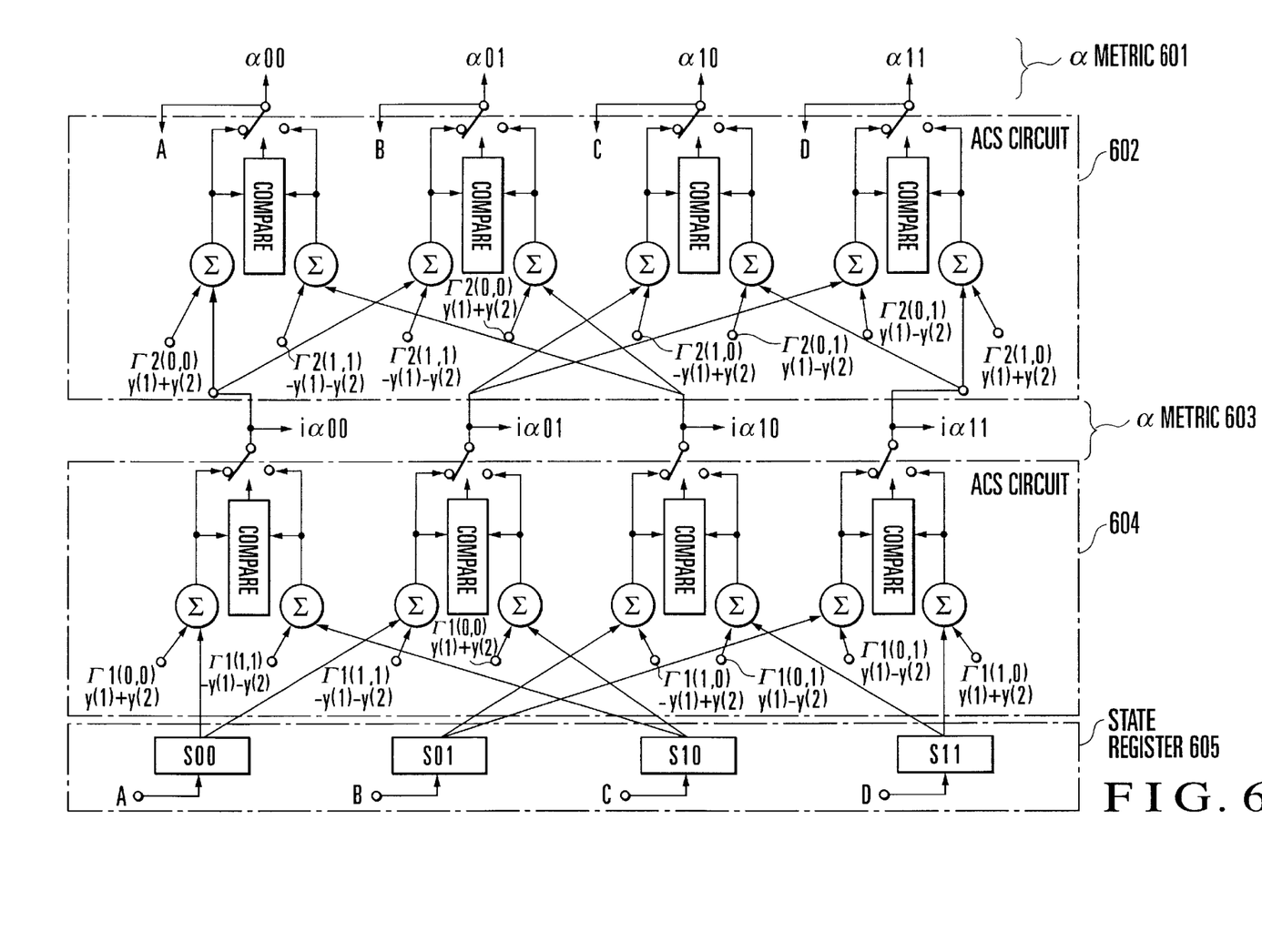
FIG. 6 is a block diagram showing multi-stage $\alpha$ metric generation of the present invention.
Figure 7:
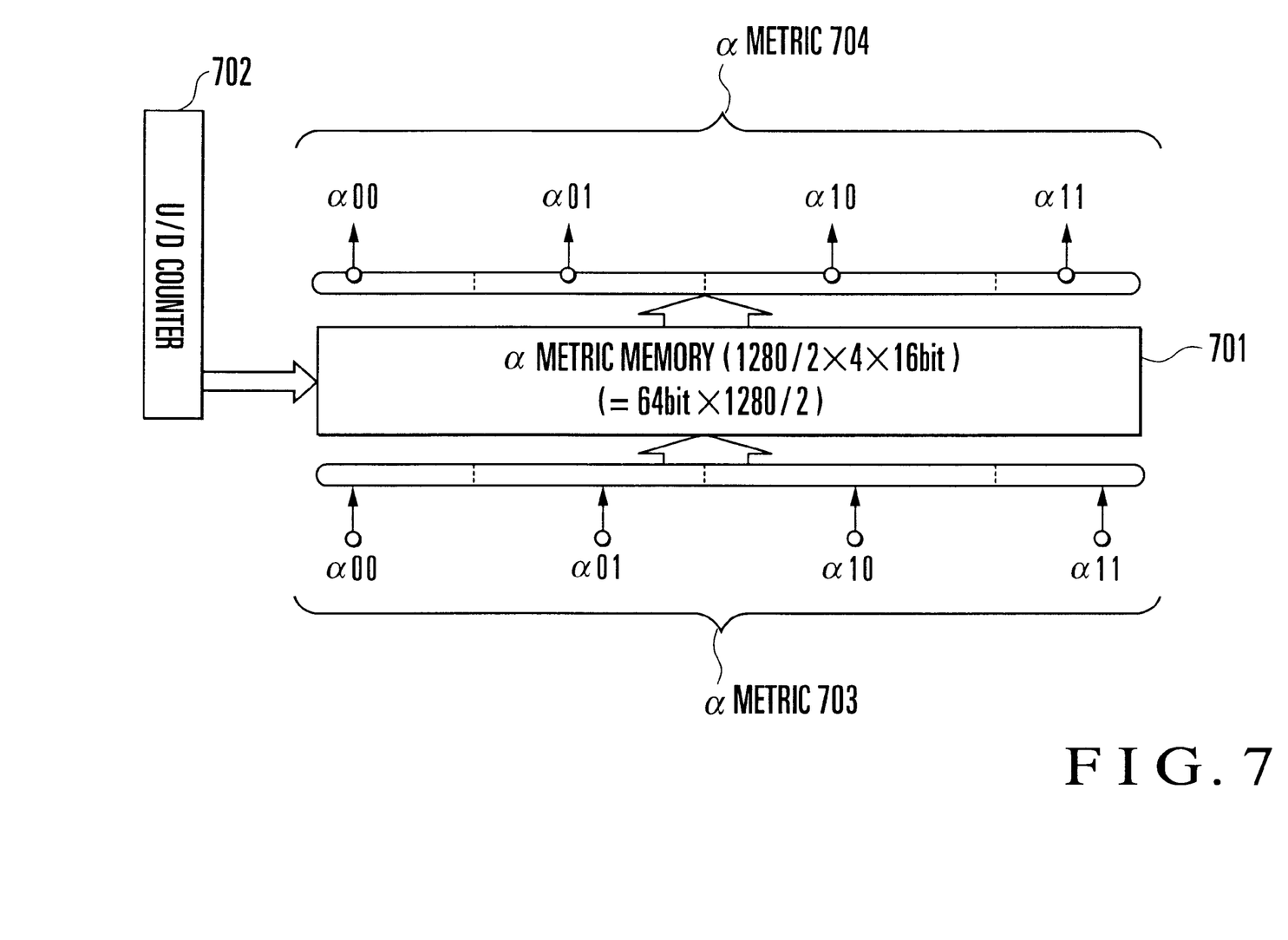
FIG. 7 is a block diagram following FIG. 6 which shows multi-stage $\alpha$ metric generation of the present invention.

The third embodiment of the present invention will be described next with reference to FIGS. 6 and 7. FIG. 6 shows an example in which a plurality of ACS circuits used to update an α metric in generating the α metric are cascade-connected. In this embodiment, two ACS circuits 602 and 604 are cascade-connected. The γ metric used at this time corresponds to two times, and two γ metric generation circuits described above are used, although not particularly illustrated.

The α metric is updated once per two cycles of the above-described processing through a state register (S00, S01, S10, and S11) 605. An α metric 601 (703 in FIG. 7) obtained at that time is stored in an α metric memory 701 shown in FIG. 7.

The increment period of a counter 702 can be longer by twice than that of the above-described method, i.e., updating is performed once per two cycles of the above-described method. For this reason, the α metric memory 701 can have only a ½ memory capacity. In addition, since the update cycle is twice, the entire processing time can be shortened by operating the counter 702 in a normal cycle.

In other words, the processing time can have a margin, and an inexpensive device can be employed. The number of circuits cascade-connected is not limited two, and a larger number of circuits may be connected. Accordingly, the capacity of the α metric memory 701 can be decreased.

The fourth embodiment of the present invention will be described next with reference to FIGS. 6 and 7. In this embodiment, the α metric memory whose capacity is reduced to ½ is used to calculate the likelihood in updating the β metric. The circuit shown in FIG. 7 outputs an α metric 704 on the basis of an address designation of a counter 702.

Since this α metric 704 has contents for time interleaved to ½, an α metric present in the interval must be generated. The interleaved contents are reproduced using an ACS circuit 604 shown in FIG. 6. More specifically, the α metric memory output 704 is used in place of a state register 605, and an α metric 603 is reproduced by the ACS circuit 604. An ACS circuit 602 following the ACS circuit 604 may be used to update the β metric by changing its arrangement, as described above.

Likelihood calculation according to the β metric update cycle is performed in the same way as described above, for which the reproduced α metric and the α metric 704 read out from an α metric memory 701 are used in this order. These metrics may be buffered for pipeline processing to increase the speed.

With this method, even when a smaller number of α metrics are used, the likelihood calculation can be executed without lowering the processing speed. This contributes to decrease the memory capacity, so power consumption and circuit scale can be effectively reduced. For example, when two ACS circuits are cascade-connected, the memory capacity decreases to ½. When three ACS circuits are cascade-connected, the memory capacity decreases to ⅓. In addition, the processing speed of α metric calculation increases, and likelihood calculation according to the β metric update cycle can also be performed without reducing the processing speed.

The fifth embodiment of the present invention will be described next. As described above, the update direction of α metric is different from that of β metric. However, likelihood can be calculated without any problem regardless of the calculation order. However, a metric that has been calculated first must be stored in a memory. Even in likelihood calculation, the update direction changes, and accordingly, connection in the ACS circuit corresponding to the trellis only changes.

Hence, in each of the above-described first to fourth embodiments, the α and β metrics may be replaced. As for the output order of likelihood calculation, the information sequence is output from the final bit to the start bit for the α metric and from the start bit to the final bit for the β metric. In any case, the metric must be temporarily stored in the memory for deinterleave processing.

The sixth embodiment of the present invention will be described next with reference to FIG. 1. A method of extracting extrinsic information LOG likelihood is shown on the right side of FIG. 1. LOG likelihood is output by the above-described likelihood calculation and input to an adder 107. A reception signal memory 101 is connected to the adder 107 through a buffer 117 to subtract soft decision data of this information sequence. The buffer 117 is used for matching the time of information bit that is the same as the LOG likelihood input to the adder 107.

The output from the adder 107 is input to an adder 106. The output from a selector 109 is input to the adder 106 through a buffer 118. The adder 106 further subtracts, from the output from the adder 107, previous information LOG likelihood as the output from one of a priori memories 103-1 and 103-2, which is selected by the selector 109. The output from the adder 106 is input to a shift-addition-type weighting circuit 108 which performs scaling to make the probability distribution of previous information LOG likelihood close to the original distribution, thereby improving the characteristics.

The weighting circuit 108 generates ½ and ¼ values by shift processing of only replacing the wire connections and adds the values to realize a 0.75-time value. The output from the weighting circuit 108 is input to the selector 109 through a switch 110. As described above, the selector 109 is used to alternately select the a priori memories 103-1 and 103-2. When one memory is used for a read as a previous information LOG likelihood memory, the other memory is used for a write as extrinsic information LOG likelihood memory.

The switch 110 is used to store the final LOG likelihood. During repetitive processing, the switch 110 is connected in the direction shown in FIG. 1. The arrangement alternately using two memories can be replaced with a single memory by employing a dual-port memory. In this case, power consumption and circuit scale can be further reduced.

The seventh embodiment of the present invention will be described next using FIG. 1. In this embodiment, operation is performed at a timing when interleave is performed in repetitive processing. In this embodiment, an interleave order exchange processing memory address generation means is implemented by a permutation memory 112 in which the exchange order is written. A random logic may be used in place of the RAM.

This permutation memory 112 is connected to two portions between stages requiring interleave through selectors 114 and 113. One portion is a reception signal memory 101 storing an information sequence, from which the reception sequence is output in the interleave order. The other portion is a priori memories 103-1 and 103-2 operating to store previous/extrinsic information LOG likelihood. The previous information LOG likelihood is read out from the a priori memories 103-1 and 103-2 in accordance with interleave order and processed, and then, the extrinsic information LOG likelihood is stored in the interleaved order. At this time, the second parity sequence is used as a parity sequence. Hence, the second parity sequence is selected by a selector 105 and read out from a reception signal memory 102.

The address operation of each memory will be described below. An up/down counter 115 performs up count operation in calculating an α metric and down count operation in calculating a β metric. The reception signal memory 102 and permutation memory 112 output data contents using the count value as an address. The permutation memory 112 also uses the output contents as an address. The addresses of all memories are operated by the output from the up/down counter 115 when no interleave is performed. Even when interleave is performed, memories other than the above-described memories are operated by the output from the up/down counter 115.

In this embodiment, the reception signal memory 102 is constructed by two memories. However, for example, the reception signal memory 102 may be constructed by one memory by selecting upper bits of an address, and the selector 105 may be omitted. The a priori memories 103-1 and 103-2 may also be formed from one memory by employing a dual-port memory. At this time, one of the two addresses, which is used for extrinsic information LOG likelihood, need be controlled to slightly delay in accordance with the processing time. This can be realized by inserting a buffer in the address line. With this processing delay, data of previous information LOG likelihood is not rewritten by extrinsic information LOG likelihood even when one memory cell is used.

An iteration control section 111 for managing the number of times of repetition controls the update direction of each metric on the basis of the difference between α metric calculation and β metric calculation. The iteration control section 111 is implemented by causing the up/down counter 115 to perform up count operation or down count operation. In the final repetitive operation, the LOG likelihood must be directly obtained. For this purpose, the a priori memories 103-1 and 103-2 are used as memories for storing LOG likelihood by controlling the switch 110.

With this arrangement, no memory for storing interleaved information sequence is required. The interleave/deinterleave means can implement both functions only by having a means for generating an interleave order. In addition, a priori memories for previous/extrinsic information LOG likelihood can be formed from one dual-port memory. Furthermore, necessary information can be supplied without any time lag, and high-speed processing is possible.

Even when pipeline processing is executed using this arrangement, processing is equivalently completed by one clock. Additionally, processing including interleave can be performed using a minimum memory capacity. Hence, the circuit can be downsized, and wide band multimedia communication for the high-speed Internet or moving image can be provided in an inexpensive form suitable to a portable terminal.

The eighth embodiment of the present invention will be described next with reference to FIG. 8. As described above, in the process of updating an α metric or β metric, a γ metric value is stored. The γ metric is normalized for the maximum value, as described in the first embodiment. However, when the transmission channel has many noise components, the maximum likelihood path on the trellis does not always pass through the normalized maximum value. For an information sequence having a long information sequence as a frame length, the information sequences are gradually stored to cause overflow of state metrics.

Figure 8:
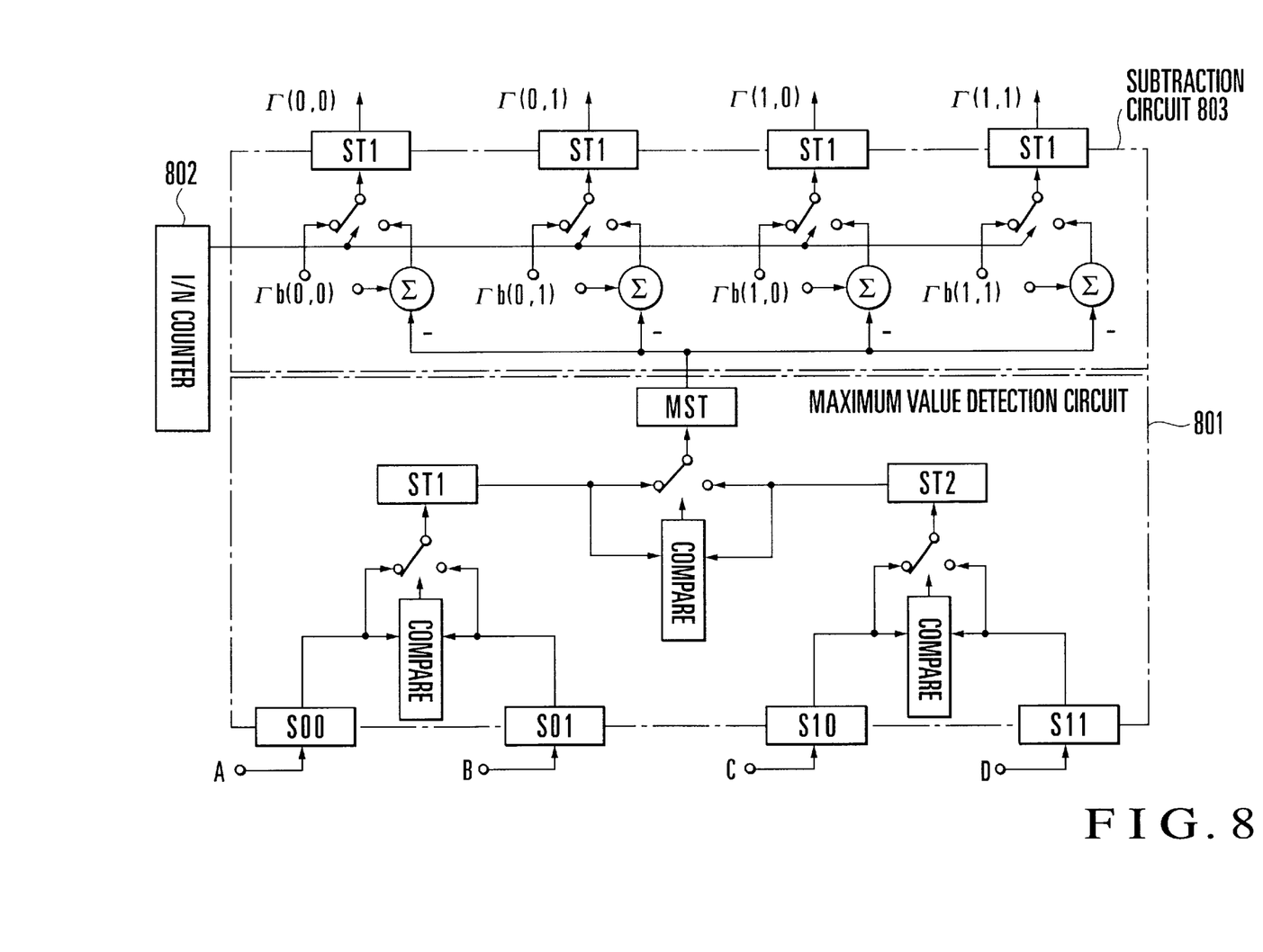
FIG. 8 is a block diagram showing state metric overflow prevention of the present invention.

To prevent this, a maximum value detection circuit 801 detects the maximum value of state metric on the basis of the metric of each state, as shown in FIG. 8, and the obtained value is subtracted from the γ metric by a subtraction circuit 803. Application of the subtracted value is controlled by a counter 802. For example, the value is applied once per four cycles. Otherwise, the switch in the subtraction circuit is connected to the normal γ metric side. Thus, the time from maximum value detection to actual application can be gained, and state metric overflow can be prevented even when a time delay occurs in a pipeline structure or the like.

With this arrangement, overflow can be prevented without using any expensive device using high-speed process for maximum value detection and while avoiding influence to the loop of ACS circuit, for which a high speed is required, by subtracting the maximum value from the γ metric.

Each section of the above-described embodiments can be pipelined except the loop in the ACS circuit, and processing is equivalently completed by one clock. For example, in normalizing the γ metric, a γ metric for all states is supplied by one clock without any delay. Although a delay due to pipeline processing occurs in likelihood calculation, the processing itself is completed by one clock.

Figure 1:
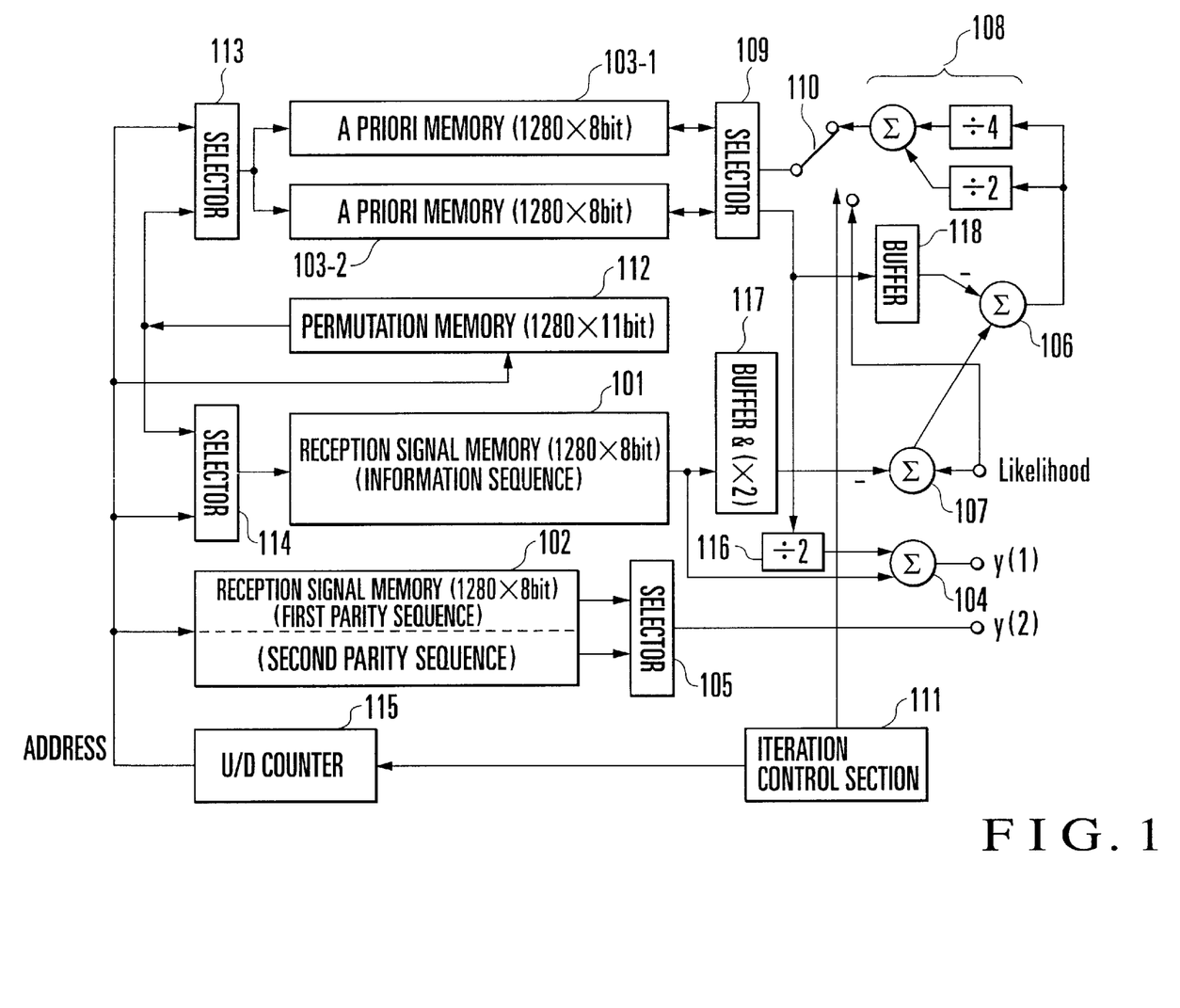
FIG. 1 is a block diagram showing the relationship between part of $\alpha$ metric generation and extrinsic information LOG likelihood and previous information LOG likelihood of the present invention.
Figure 2A:
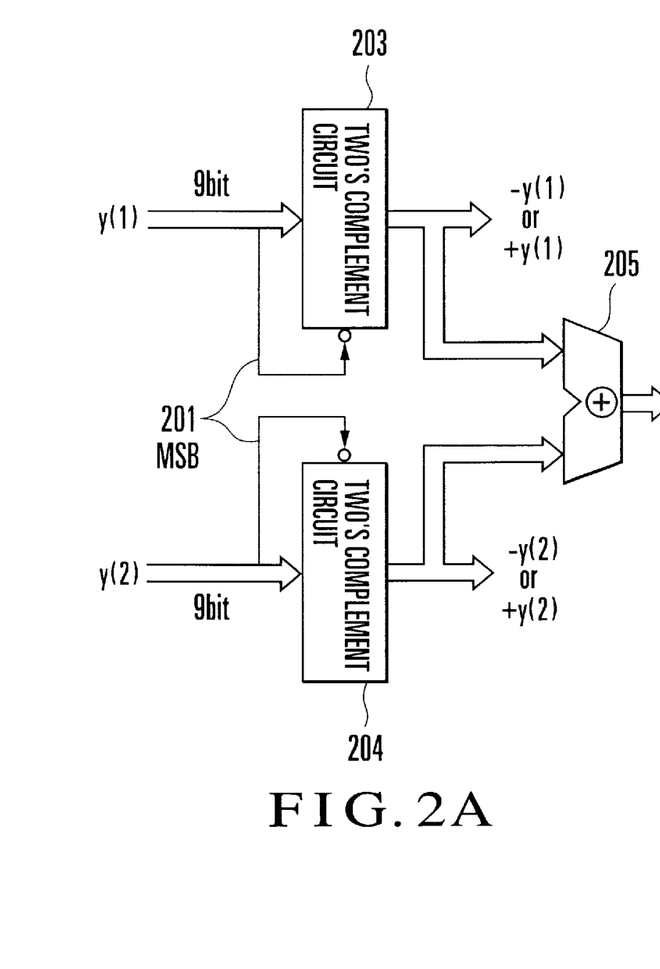
FIGS. 2A and 2B are block diagrams showing $\gamma$ metric normalization of the present invention.
Figure 2B:
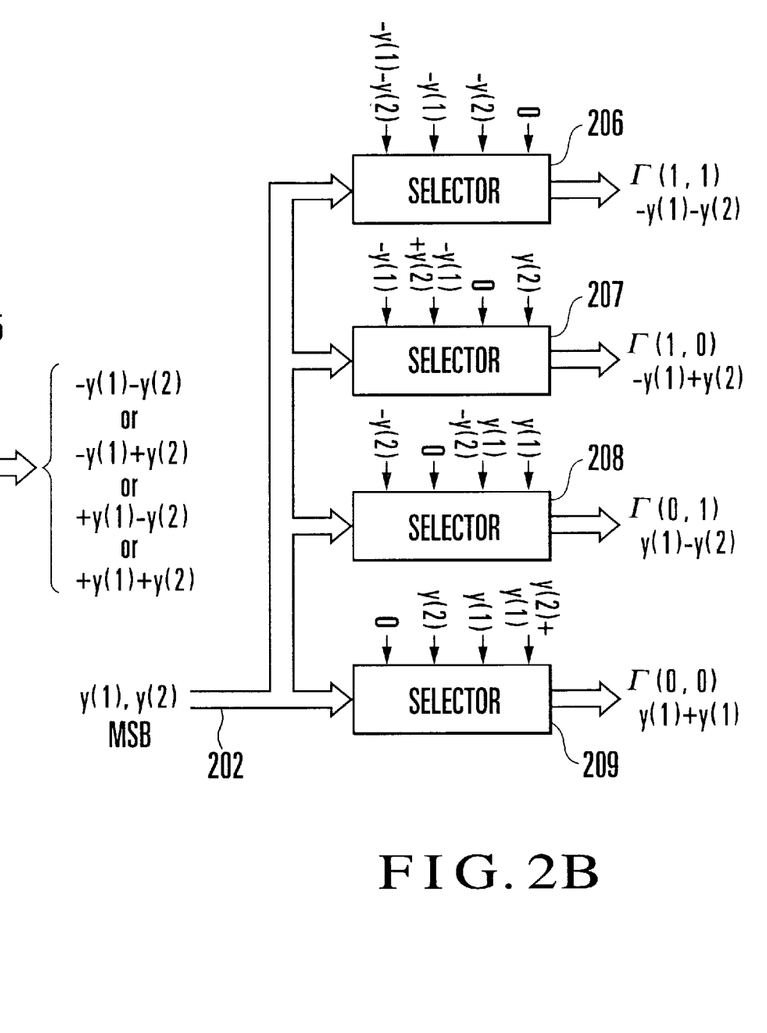

This delay can be synchronized with extrinsic information LOG likelihood generation by buffering, as shown in FIG. 1. All of these processing operations can be pipelined and equivalently completed by one clock. That is, an inexpensive wide band multimedia portable communication terminal requiring a high speed can be provided.

According to the turbo-code decoder of the present invention, a decoder for attaining the correcting performance close to the Shannon limit is be provided as a wide band multimedia portable communication terminal for the high-speed Internet or moving image data. More specifically, since the γ metric can be normalized and supplied without any delay, and processing requiring interleave/deinterleave can be realized using minimum memories and minimum interleave means, a high-speed, high-performance decoder can be provided at low cost.

Since the memory capacity (α metric+β metric) required for a state metric can be halved (α metric or β metric), the circuit scale and power consumption can be reduced.

For likelihood calculation, data obtained upon updating, e.g., a β metric can be applied. Hence, a circuit therefore can be omitted, and the circuit scale and power consumption can be reduced. According to the present invention, the state metric memory capacity can be further decreased, and the speed can be increased by connecting a number of ACS circuits.

Since the maximum value of state metric is intermittently subtracted from the γ metric, state metric overflow can be prevented without reducing the processing speed.

What is claimed is:

1. A turbo-code decoder comprising:
a first reception signal memory for storing an information sequence;
a second reception signal memory for storing first and second parity sequences;
an a priori memory for storing extrinsic/previous information in repetitive processing;
a first adder for adding the information sequence read out from said first reception signal memory and the previous information read out from said a priori memory;
first selection means for selecting one of the first and second parity sequences read out from said second reception signal memory; and
second selection means for, on the basis of a polarity of a calculation result from said first adder and a polarity of a selection output from said first selection means, selecting one of the sum from said first adder including a negative polarity, the selection output from said first selection means including a negative polarity, a sum of the sum of the first adder and said selection output, and zero, wherein an α metric and β metric are calculated on the basis of an output from said second selection means.

2. A decoder according to claim 1, wherein said decoder further comprises an α metric memory for storing the α metric calculated on the basis of a γ metric, and when the β metric is sequentially updated on the basis of the γ metric, a sum of the β metric and γ metric, which is obtained upon calculating the β metric, is used for likelihood calculation.

3. A decoder according to claim 2, wherein in calculating the α metric to be input to said α metric memory, an update cycle of α metric is performed in accordance with a plurality of ACS (Add-Compare-Select) circuits cascade-connected, and a result from a final stage of the cascade-connected ACS circuits is input to said α metric memory.

4. A decoder according to claim 3, wherein said α metric memory and the cascade-structure of ACS circuits are used for likelihood calculation, and likelihood calculation is performed on the basis of the sum of the β metric and γ metric, which is obtained upon updating the β metric, and an output result from each stage of the ACS circuits.

5. A decoder according to claim 1, wherein said decoder further comprises a β metric memory for storing the β metric calculated on the basis of a γ metric, and when the α metric is sequentially updated on the basis of the γ metric, a sum of the α metric and γ metric, which is obtained upon calculating the α metric , is used for likelihood calculation.

6. A decoder according to claim 5, wherein in calculating the β metric to be input to said β metric memory, an update cycle of β metric is performed in accordance with a plurality of ACS (Add-Compare-Select) circuits cascade-connected, and a result from a final stage of the cascade-connected ACS circuits is input to said β metric memory.

7. A decoder according to claim 6, wherein said β metric memory and the cascade-structure of ACS circuits are used for likelihood calculation, and likelihood calculation is performed on the basis of the sum of the α metric and γ metric, which is obtained upon updating the α metric , and an output result from each stage of the ACS circuits.

8. A decoder according to claim 1, wherein the output from said first reception signal memory storing the information sequence and the output from said a priori memory are subtracted from a likelihood calculation result, and a result obtained by executing shift-addition-type weighting on the subtraction result is stored in said a priori memory as extrinsic information.

9. A decoder according to claim 1, wherein said decoder further comprises address generation means for generating an interleave order in repetitive processing as a memory address, and said first reception signal memory and a priori memory are accessed from the address generated by said memory address means.

10. A decoder according to claim 1, wherein said decoder further comprises detection means for detecting a maximum value from a calculation result for each state obtained by calculating the α metric, and subtraction means for subtracting the detection result from said detection means from a γ metric, and the α metric is calculated as pipeline processing, and a subtraction result is newly used as a γ metric at a predetermined timing.

* * * * *